(12) United States Patent
Clauberg et al.

(10) Patent No.: US 9,847,313 B2
(45) Date of Patent: Dec. 19, 2017

(54) THERMOCOMPRESSION BONDERS, METHODS OF OPERATING THERMOCOMPRESSION BONDERS, AND HORIZONTAL SCRUB MOTIONS IN THERMOCOMPRESSION BONDING

(71) Applicant: Kulicke and Soffa Industries, Inc., Fort Washington, PA (US)

(72) Inventors: Horst Clauberg, Warwick, PA (US); Thomas J. Colosimo, Jr., West Chester, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 5 days.

(21) Appl. No.: 15/131,610

(22) Filed: Apr. 18, 2016

(65) Prior Publication Data
US 2016/0315064 A1 Oct. 27, 2016

Related U.S. Application Data

(60) Provisional application No. 62/152,297, filed on Apr. 24, 2015.

(51) Int. Cl.
*B23K 31/02* (2006.01)
*H01L 23/00* (2006.01)
(Continued)

(52) U.S. Cl.
CPC ............ *H01L 24/75* (2013.01); *B23K 20/002* (2013.01); *B23K 20/023* (2013.01); *H01L 24/81* (2013.01);
(Continued)

(58) Field of Classification Search
CPC ... H01L 24/75; H01L 24/81; H01L 2224/131; H01L 2224/81191; H01L 2224/81121;
(Continued)

(56) References Cited

U.S. PATENT DOCUMENTS 4,200,393 A * 4/1980 Suzuki ................. H01L 21/681
228/9
4,719,810 A * 1/1988 St Cyr ..................... F16H 25/20
74/89.23
(Continued)

FOREIGN PATENT DOCUMENTS

CN 1574258 A * 2/2005
JP 59111336 A * 6/1984
(Continued)

OTHER PUBLICATIONS

Machine translation JP 2004014715 A (no date available).*

*Primary Examiner* — Kiley Stoner
(74) *Attorney, Agent, or Firm* — Stradley Ronon Stevens & Young, LLP (57) ABSTRACT

A method of operating a thermocompression bonding system is provided. The method includes the steps of: bringing first conductive structures of a semiconductor element into contact with second conductive structures of a substrate in connection with a thermocompression bonding operation; and moving the semiconductor element relative to the substrate along at least one substantially horizontal direction using a motion system of at least one of the semiconductor element and the substrate.

23 Claims, 11 Drawing Sheets

(51) Int. Cl.
*B23K 20/02* (2006.01)
*B23K 20/00* (2006.01)

(52) U.S. Cl.
CPC .............. *H01L 24/13* (2013.01); *H01L 24/16* (2013.01); *H01L 2224/131* (2013.01); *H01L 2224/13082* (2013.01); *H01L 2224/16238* (2013.01); *H01L 2224/75252* (2013.01); *H01L 2224/75804* (2013.01); *H01L 2224/75824* (2013.01); *H01L 2224/75841* (2013.01); *H01L 2224/81121* (2013.01); *H01L 2224/81191* (2013.01); *H01L 2224/81203* (2013.01); *H01L 2224/81815* (2013.01)

(58) Field of Classification Search
CPC . H01L 2224/75252; H01L 2224/81815; H01L 24/13; H01L 24/16; H01L 2224/13082; H01L 2224/16238; H01L 2224/75824; H01L 224/75841; H01L 2224/75804; H01L 224/81203; H01L 2224/11; B23K 20/023; B23K 20/002; B23K 1/0016; B23K 3/00–3/087; B23K 2201/36–2201/42
USPC ......... 228/102–103, 105, 179.1–180.22, 4.1, 228/6.2, 8–12, 44.7, 49.5
See application file for complete search history.

(56) References Cited

U.S. PATENT DOCUMENTS

| | | | | | |
|---|---|---|---|---|---|
| 5,163,728 | A | * | 11/1992 | Miller | H01L 21/68707 29/740 |
| 5,341,979 | A | * | 8/1994 | Gupta | H01L 24/11 228/111 |
| 6,119,918 | A | * | 9/2000 | Yang | B23K 20/10 228/102 |
| 6,129,259 | A | * | 10/2000 | Stansbury | H01J 9/241 228/105 |
| 6,193,132 | B1 | * | 2/2001 | Shibata | B23K 3/04 228/103 |
| 6,250,933 | B1 | * | 6/2001 | Khoury | G01R 1/06738 324/755.07 |
| 6,265,244 | B1 | * | 7/2001 | Hayashi | H01L 24/11 257/E21.508 |
| 6,543,668 | B1 | * | 4/2003 | Fujii | B23K 20/023 228/103 |
| 6,729,532 | B2 | * | 5/2004 | Inoue | H05K 3/3442 228/180.1 |
| 8,623,754 | B1 | | 1/2014 | Ryan | H01L 24/13 257/673 |
| 9,093,549 | B2 | * | 7/2015 | Wasserman | B23K 3/085 |
| 9,165,902 | B2 | * | 10/2015 | Wasserman | H01L 24/11 |
| 9,576,928 | B2 | * | 2/2017 | Wasserman | H01L 24/75 |
| 9,640,507 | B2 | * | 5/2017 | Han | H01L 21/67766 |
| 2003/0019909 | A1 | | 1/2003 | Beatson | B23K 20/002 228/102 |
| 2004/0060663 | A1 | * | 4/2004 | Haraguchi | B23K 20/005 156/349 |
| 2005/0071991 | A1 | * | 4/2005 | Yonezawa | H05K 13/0413 29/740 |
| 2005/0077340 | A1 | * | 4/2005 | Nagafuku | H05K 13/08 228/8 |
| 2005/0139973 | A1 | * | 6/2005 | Matsumura | H01L 21/6836 257/678 |
| 2005/0241143 | A1 | * | 11/2005 | Mizuno | H01L 24/81 29/739 |
| 2006/0076388 | A1 | * | 4/2006 | Sato | B23K 1/018 228/102 |
| 2006/0169746 | A1 | * | 8/2006 | Ozaki | H01L 24/75 228/101 |
| 2006/0252233 | A1 | * | 11/2006 | Honma | H01L 21/67132 438/464 |
| 2007/0181653 | A1 | * | 8/2007 | Michaelson | B23K 37/047 228/123.1 |
| 2009/0049687 | A1 | * | 2/2009 | Shiraishi | H01L 23/49811 29/839 |
| 2009/0294511 | A1 | * | 12/2009 | Fleming | B23K 20/125 228/103 |
| 2011/0209548 | A1 | * | 9/2011 | Geisler | H01L 22/12 73/627 |
| 2012/0098126 | A1 | * | 4/2012 | Iwasaki | H01L 24/11 257/737 |
| 2012/0125977 | A1 | * | 5/2012 | DeAngelis | B23K 20/007 228/110.1 |
| 2012/0127485 | A1 | * | 5/2012 | Yamauchi | H01L 24/75 356/614 |
| 2012/0214258 | A1 | * | 8/2012 | Kihara | H01L 21/67144 438/5 |
| 2012/0298009 | A1 | * | 11/2012 | Endoh | B22F 1/0018 106/287.18 |
| 2013/0323531 | A1 | * | 12/2013 | Nakagawa | B23K 20/021 428/648 |
| 2014/0026675 | A1 | * | 1/2014 | Ryan | H01L 24/14 73/818 |
| 2014/0026676 | A1 | * | 1/2014 | Ryan | H01L 24/14 73/826 |
| 2014/0218881 | A1 | * | 8/2014 | Tanida | H01L 24/81 361/760 |
| 2015/0028085 | A1 | * | 1/2015 | Endoh | B22F 1/0018 228/224 |
| 2015/0083786 | A1 | * | 3/2015 | Okamoto | H01L 21/67092 228/102 |
| 2016/0037694 | A1 | * | 2/2016 | Kawaguchi | H05K 13/0413 29/739 |
| 2016/0079199 | A1 | * | 3/2016 | Seok | H01L 24/75 228/102 |
| 2016/0079200 | A1 | * | 3/2016 | Komuta | H01L 24/81 228/180.22 |
| 2017/0092614 | A1 | * | 3/2017 | Iwasaki | H01L 24/81 |

FOREIGN PATENT DOCUMENTS

| | | | | |
|---|---|---|---|---|
| JP | 03076236 A | * | 4/1991 | |
| JP | 04163925 A | * | 6/1992 | |
| JP | 2004014715 A | * | 1/2004 | |
| JP | 2004140044 A | * | 5/2004 | |
| JP | 2008135708 A | * | 6/2008 | ............ B23K 31/02 |
| JP | 4260712 B2 | * | 4/2009 | |
| KR | 1020020090813 A | * | 12/2002 | |

* cited by examiner

THERMOCOMPRESSION BONDERS, METHODS OF OPERATING THERMOCOMPRESSION BONDERS, AND HORIZONTAL SCRUB MOTIONS IN THERMOCOMPRESSION BONDING

CROSS-REFERENCE TO RELATED APPLICATION

This application claims the benefit of U.S. Provisional Patent Application No. 62/152,297, filed Apr. 24, 2015, the content of which is incorporated herein by reference.

FIELD

The invention relates to the formation of electrical interconnections in semiconductor packages, and more particularly, to improved thermocompression bonding systems and methods of operating the same.

BACKGROUND

In certain aspects of the semiconductor packaging industry, semiconductor elements are bonded to bonding locations. For example, in conventional die attach (also known as die bonding) applications, a semiconductor die is bonded to a bonding location of a substrate (e.g., a leadframe, another die in stacked die applications, a spacer, etc.). In advanced packaging applications, semiconductor elements (e.g., bare semiconductor die, packaged semiconductor die, etc.) are bonded to bonding locations of a substrate (e.g., a leadframe, a PCB, a carrier, a semiconductor wafer, a BGA substrate, etc.). Conductive structures (e.g., traces, conductive bumps, contact pads, solder bumps, conductive pillars, copper pillars, etc.) provide electrical interconnection between the semiconductor elements and the bonding locations.

In many applications (e.g., thermocompression bonding of semiconductor elements), solder material is included in the conductive structures. In such processes, heat is applied to the semiconductor element being bonded (e.g., through a heater in a bond head assembly carrying the bond tool and/or through the support structure supporting the substrate).

Misalignment between conductive structures of the semiconductor element and the substrate continues to be a challenge in certain thermocompression bonding operations. Thus, it would be desirable to provide improved methods for operating thermocompression bonding systems to overcome certain misalignment challenges.

SUMMARY

According to an exemplary embodiment of the invention, a method of operating a thermocompression bonding system is provided. The method includes the steps of: bringing first conductive structures of a semiconductor element into contact with second conductive structures of a substrate in connection with a thermocompression bonding operation; and moving the semiconductor element relative to the substrate along at least one substantially horizontal direction using a motion system of at least one of the semiconductor element and the substrate.

According to another exemplary embodiment of the invention, a thermocompression bonder is provided. The thermocompression bonder includes a support structure for supporting a substrate; a bonding tool for bonding a semiconductor element to the substrate; and a motion system configured to provide relative movement between the semiconductor element and the substrate during a thermocompression bonding operation.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION

As used herein, the term "semiconductor element" is intended to refer to any structure including (or configured to include at a later step) a semiconductor chip or die. Exemplary semiconductor elements include a bare semiconductor die, a semiconductor die on a substrate (e.g., a leadframe, a PCB, a carrier, a semiconductor chip, a semicondcutor wafer, a BGA substrate, a semiconductor element, etc.), a packaged semiconductor device, a flip chip semiconductor device, a die embedded in a substrate, a stack of semiconductor die, amongst others. Further, the semiconductor element may include an element configured to be bonded or otherwise included in a semiconductor package (e.g., an interposer, a spacer to be bonded in a stacked die configuration, a substrate, etc.).

As used herein, the terms "substrate" and "workpiece" are intended to refer to any structure to which a semiconductor element may be bonded (e.g., thermocompressively bonded, etc.). Exemplary substrates include, for example, a leadframe, a PCB, a carrier, a semiconductor chip, a semicondcutor wafer, a BGA substrate, a semiconductor element, etc.

According to certain exemplary embodiments, the invention relates to thermocompression bonding of semiconductor die, and is highly applicable to the thermocompressive bonding of such semiconductor die to substrate traces (e.g., copper traces on organic substrates, or other materials, etc.). The invention has many other applications, for example, bonding a semiconductor die onto another semiconductor die (e.g., die stacking), or bonding a semiconductor die onto a wafer or interposers (e.g., Si, glass, etc.).

A very specific application of the invention includes the thermocompression bonding of a semiconductor die (including copper pillars on the die, and solder cap/contact portions on the copper pillars) to a substrate having conductive structures (e.g., bumps, traces, etc.) that are smaller than (or similar in size to the diameter of the copper pillars on the die). In such an application, a small offset in initial placement (alignment between the semiconductor die and the substrate) can cause large lateral forces to develop during vertical compression. The lateral forces put undesirable stress on the conductive structures on the substrate, which could cause damage at the interface between such conductive structures and the die, or damage to internal layers (such as dielectrics) of the die, as well as further positional errors.

To reduce the potential undesirable effects of such offsets in initial placement, a lateral scrub may be provided (e.g., lateral motions along the x-axis, the y-axis, etc.) to smooth out the solder as the vertical force is applied. As the conductive structures on the substrate (e.g., traces) move into the solder of the corresponding conductive structure on the die, the solder is pushed sideways to even it out, thereby preventing the formation of solder structures that push against the side of the conductive structures on the substrate. For example, the lateral motion can be executed such that the amount of solder being pushed at any one time is small, such that lateral forces associated with the scrub motion are small. A lateral rocking motion can also help to push the conductive structure into the solder at lower forces than without the lateral motions. This lowering of the required vertical (i.e., Z) force to achieve a target Z deformation can be affected by lateral motions at any angle relative to the conductive structure. The scrub motion may also be useful for removing oxides, contamination, surface finishes, or otherwise cleaning the surfaces involved in making the connection.

Thus, aspects of the invention relate to the use of horizontal motions to improve the quality of thermocompression bonds. Such horizontal motions can help to smooth out the surface of solder included in the conductive structure on the semiconductor element, for example, in the case of bonding copper pillars (having solder caps) on a die to conductive traces on a substrate, where the pillar size/diameter is of a similar (or smaller) size as compared to the bump size/diameter in at least one direction. The scrubbing motions may be, for example, linear, circular, elliptical, etc. The scrubbing motions may be, for example, in a single direction, in a series of cyclical motions, etc.

Figure 1:
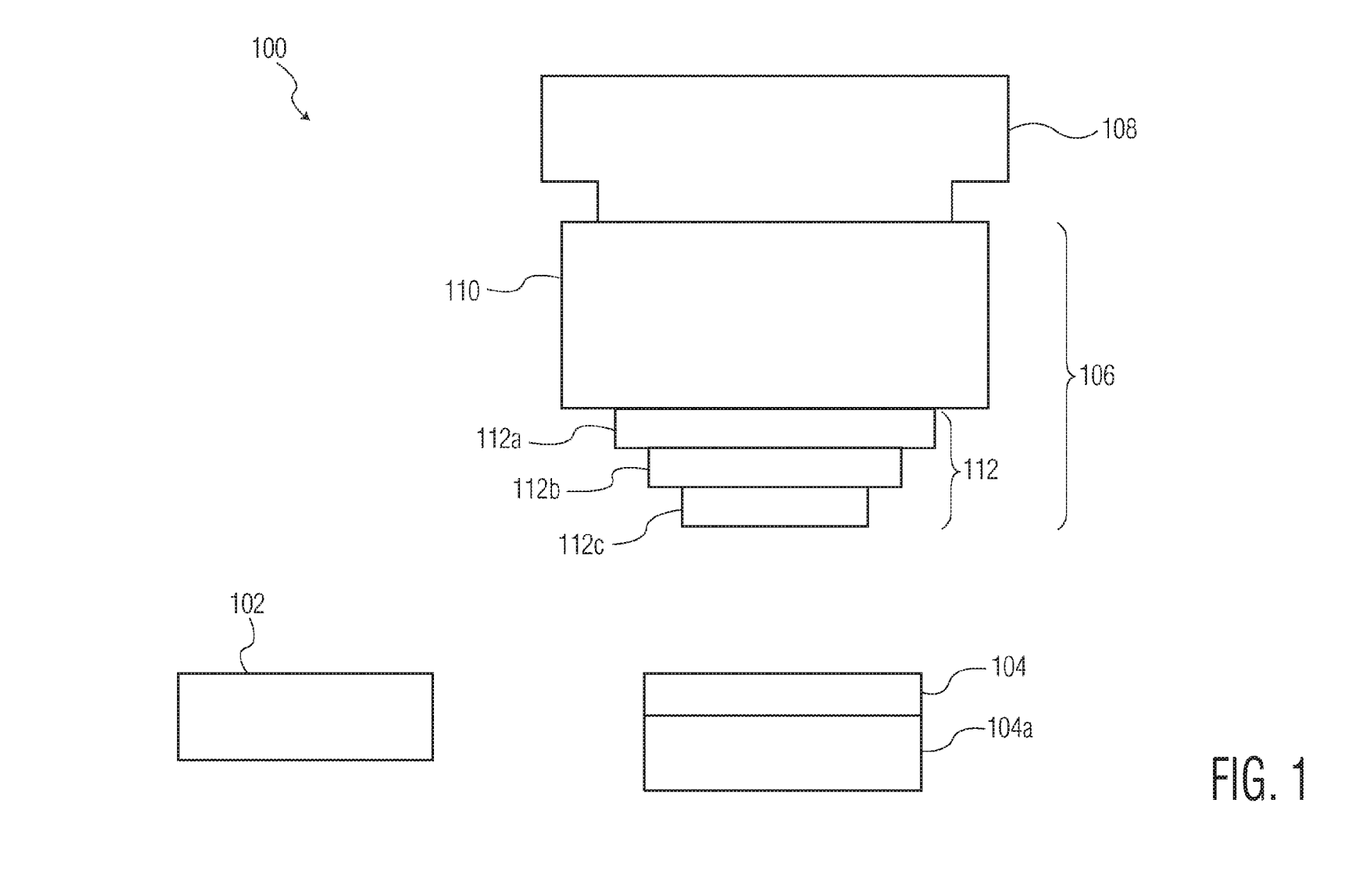
FIG. 1 is a block diagram view of portions of a thermocompression bonder, including a bond head assembly, in accordance with an exemplary embodiment of the invention.

Referring now to the drawings, FIG. 1 illustrates exemplary thermocompression bonder 100. Bonder 100 includes bond head assembly 106 including upper bond head 110 (driven by motion system 108, for example, along any desired axes such as a vertical z-axis for providing bond force during thermocompression bonding, and any combination of the horizontal x-axis and y-axis) and lower bond head 112. Lower bond head 112 is coupled to upper bond head 110. As such, various motions of upper bond head 110 will result in corresponding motions of lower bond head 112. Such motions may be provided, for example, by motion system 108 (e.g., including servo controlled linear motors for moving bond head assembly 106 along the desired axes). Lower bond head 112 includes base structure 112a (which desirably includes cooling channels for receiving a fluid for cooling heater 112b during cooling phases of the process), heater 112b, and bonding tool 112c. As will be appreciated by those skilled in the art, heater 112b may be a heated bond tool configured to carry and bond a semiconductor element (not shown in FIG. 1), and as such, a separate bonding tool 112c may be omitted. That is, the terms heater and bond/bonding tool may be used interchangeably, and may be integrated into a single component or may be multiple separate components (as shown in the exemplary embodiment illustrated in FIG. 1). Heater/bonding tool 112b/112c bonds a semiconductor element to a substrate at bonding station 104. Bonding station 104 includes motion system 104a for moving a support structure of bonding station 104 along one or more axes. For example, a servo controlled linear motor may be used to provide such motion along the x-axis, along the y-axis, along both the x-axis and the y-axis, etc. In a direct pick and place embodiment, heater/bonding tool 112b/112c may pick a semiconductor element from supply station 102 (e.g., a semiconductor wafer or other structure providing semiconductor elements), and bond the element to a substrate at bonding station 104. Embodiments using a transfer between a pick tool and a place tool (or a plurality of transfers) are also contemplated.

Figure 2:
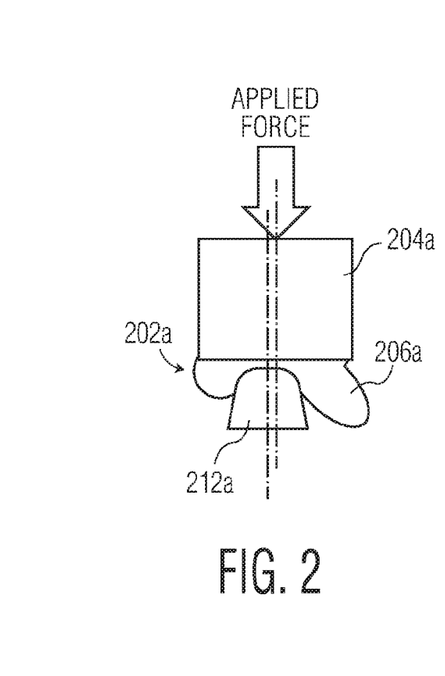
FIG. 2 is a block diagram illustrating interconnection between conductive structures during a thermocompression bonding operation.

FIG. 2 illustrates portions of a conductive interconnect structure during a thermocompression bonding process. While FIG. 2 illustrates a single conductive interconnect structure, it is understood that many such conductive interconnect structures may be included when bonding a single semiconductor element to a substrate. An upper conductive structure 202a (included on a die, not shown) includes a conductive pillar 204a and a solder contact portion 206a (already deformed in FIG. 2). Upper conductive structure 202a is bonded to lower conductive structure 212a (where lower conductive structure 212a is on a substrate, not shown). As shown by the offset of the center line of the interconnect, upper conductive structure 202a is offset from (and not in proper alignment with) lower conductive structure 212a. This has the undesirable results described above.

FIGS. 3A-3C, 4A-C, and 5A-5C illustrate example approaches to overcome the problem illustrated in FIG. 2.

Figure 3A:
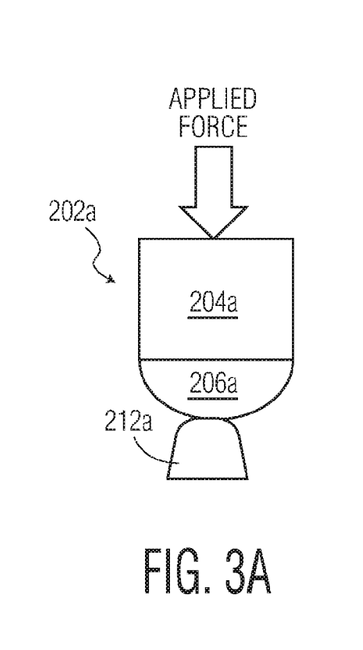
FIGS. 3A-3C, 4A-4C, and 5A-5C are multiple series of block diagram views of interconnections between conductive structures during a thermocompression bonding operation in accordance with an exemplary embodiment of the invention.
Figure 3B:
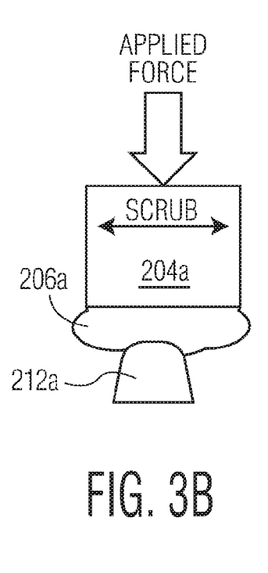
Figure 3C:
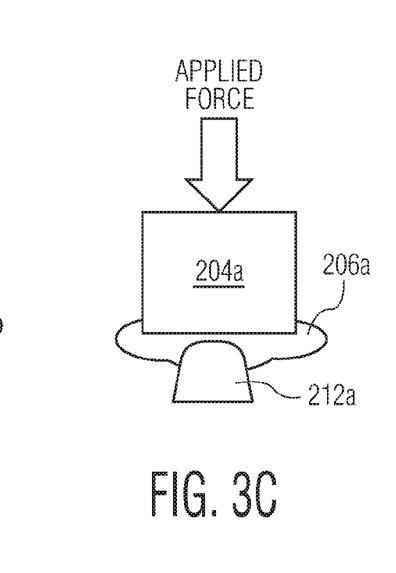
Figure 4A:
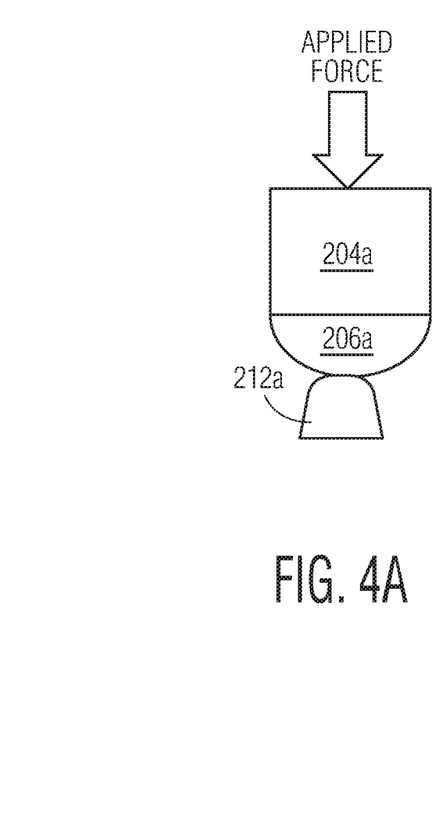
Figure 4B:
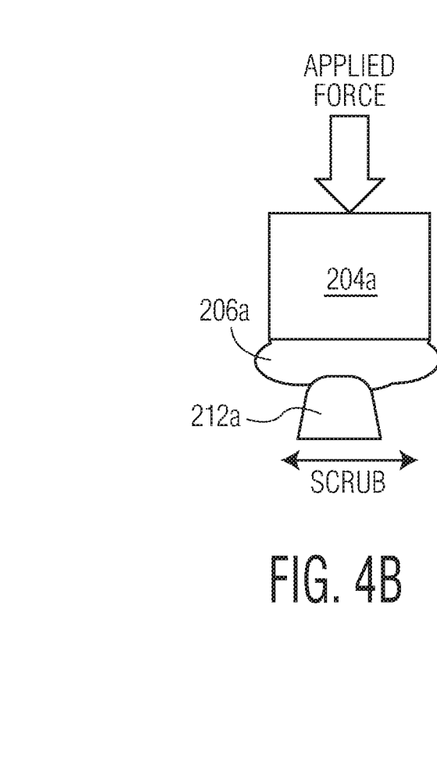
Figure 4C:
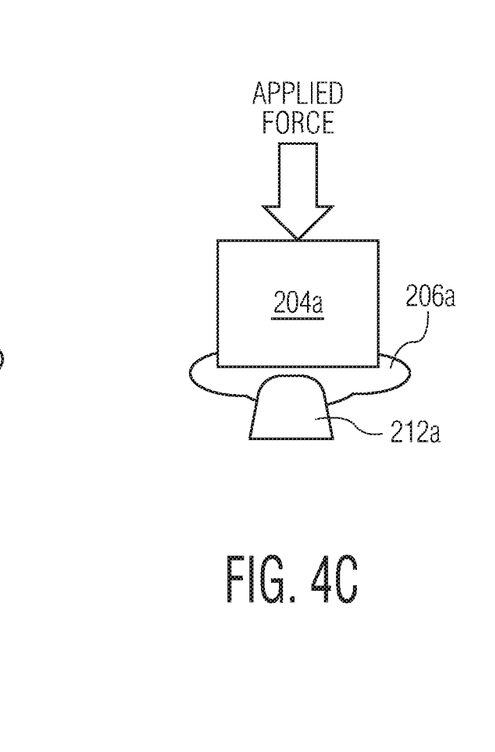
Figure 5A:
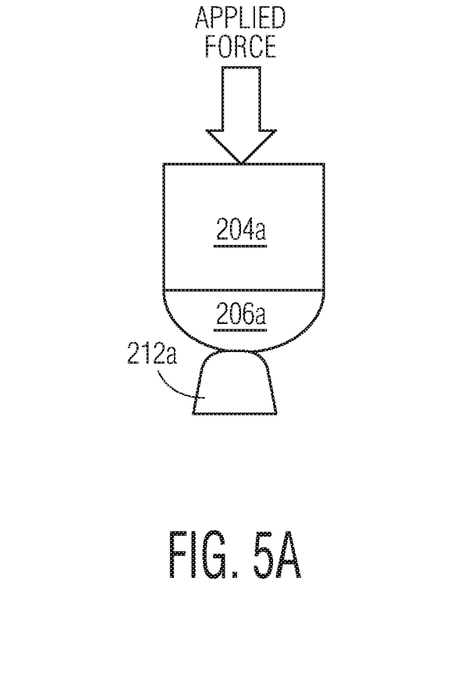
Figure 5B:
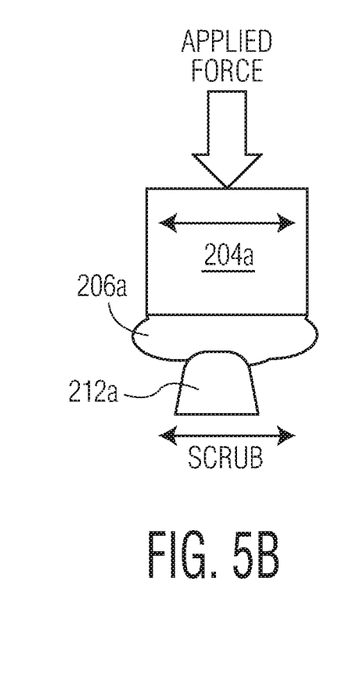
Figure 5C:
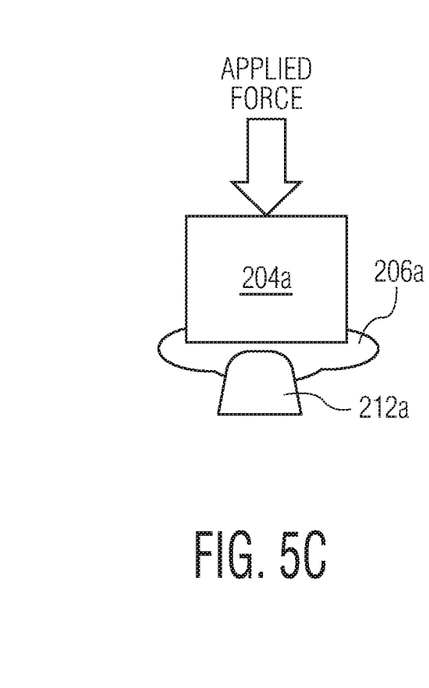

In FIG. 3B, a linear motion (scrub) is applied through upper conductive structure 202a (as illustrated by the double headed arrow). In FIG. 4B, a linear motion (scrub) is applied through lower conductive structure 212a (as illustrated by the double headed arrow). In FIG. 5B, a linear motion (scrub) is applied through each of upper conductive structure 202a and lower conductive structure 212a (as illustrated by the two double headed arrows). While the arrows illustrate linear scrub only at FIGS. 3B, 4B, and 5B (after contact between upper conductive structure 202a and lower conductive structure 212a), it is understood that the linear scrub could be commenced at any time, as desired, for example, before contact. Further, while FIGS. 3B, 4B, and 5B illustrate linear scrub along a single linear direction, this is illustrative only and it is understood that the linear scrub may be in multiple directions, non-linear (e.g., curved, circular, etc.) directions, etc. FIGS. 3A, 4A, and 5A illustrate the conductive interconnect structures before the respective motion/scrub of FIGS. 3B, 4B, and 5B. FIGS. 3C, 4C, and 5C illustrate the conductive interconnect structures after the respective motion/scrub of FIGS. 3B, 4B, and 5B.

Figure 6A:
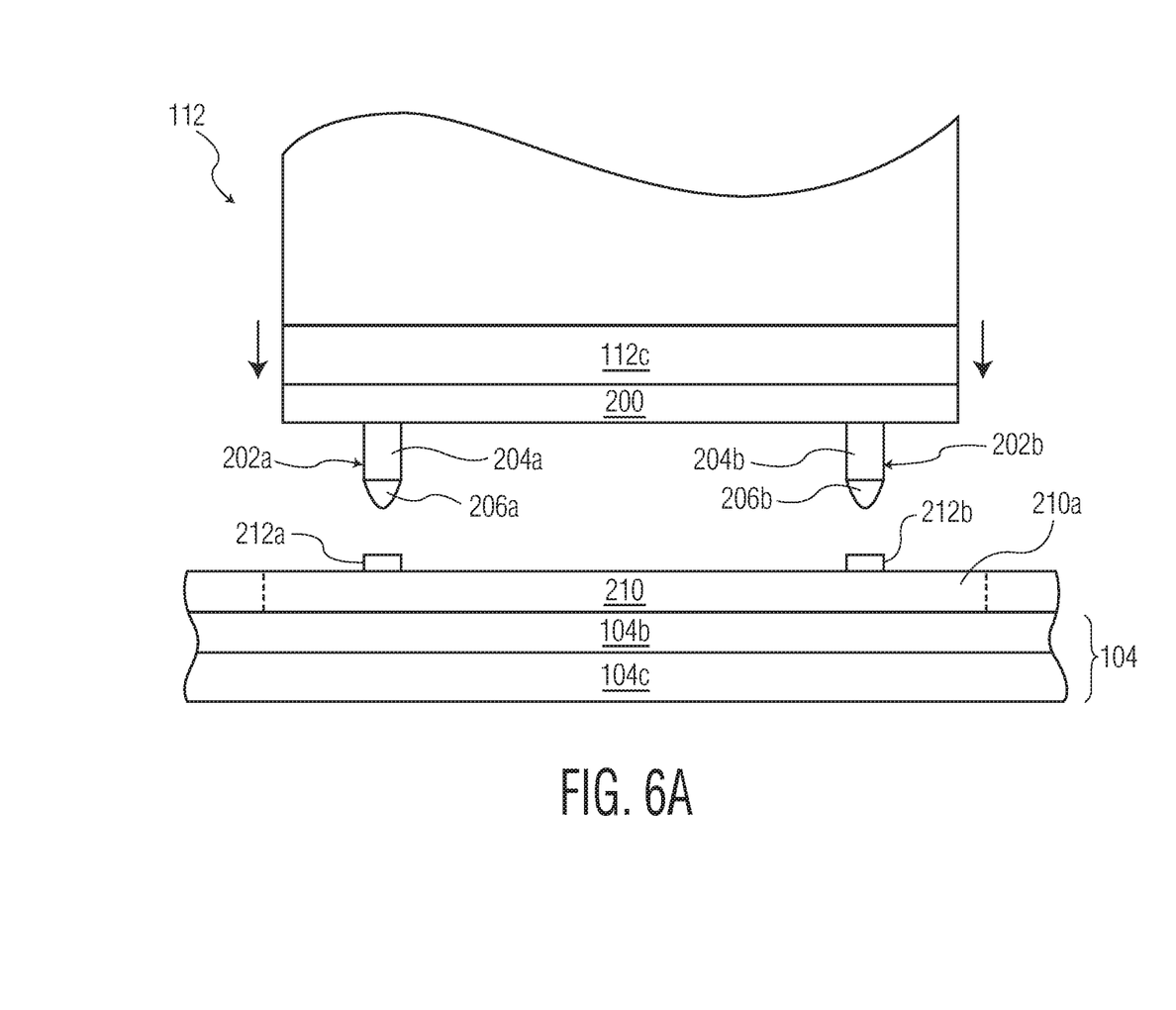
FIGS. 6A-6B, 7A-7B, and 8A-8B are multiple series of block diagram views of portions of a thermocompression bonder during a thermocompression bonding operation in accordance with an exemplary embodiment of the invention.
Figure 6B:
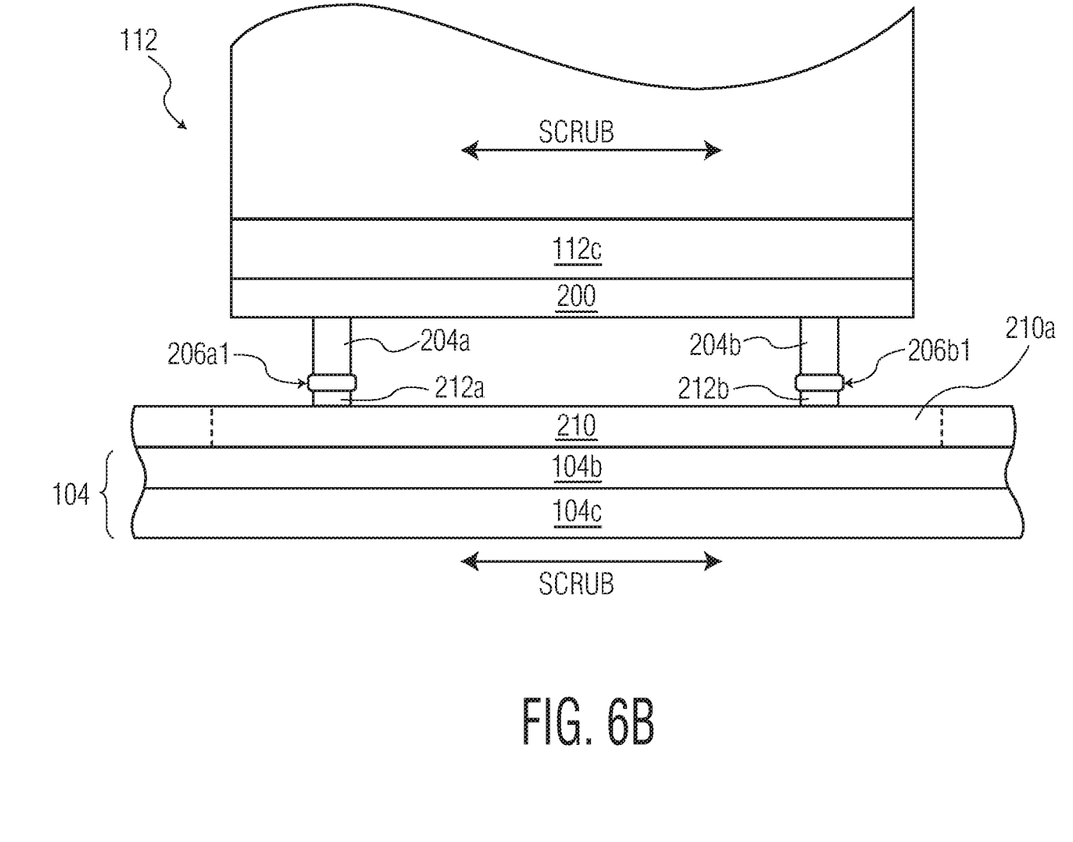

FIG. 6A illustrates bonding tool 112c (included in lower bond head 112) carrying semiconductor element 200 (e.g., a semiconductor die). Upper conductive structures 202a, 202b (e.g., each including respective conductive pillars 204a, 204b such as copper pillars, and corresponding solder contact portions 206a, 206b) are provided on semiconductor element 200. After alignment, bonding tool 112c is lowered such that such that upper conductive structures 202a, 202b contact lower conductive structures 212a, 212b on bonding location 210a of substrate 210 (as will be appreciated, a substrate may include a plurality of bonding locations configured to receive a plurality of semiconductor elements). In the example shown in FIG. 6A, substrate 210 is supported by bonding station 104, where bonding station 104 includes a support structure 104b (e.g., an application specific part) on a bond stage 104c. In FIG. 6B, through a thermocompressive bonding process, solder contact portions 206a, 206b are reshaped as solder interfaces 206a1, 206b1, providing a conductive coupling between ones of upper conductive structures 202a, 202b and respective lower conductive structures 212a, 212b. Although FIGS. 6A-6B illustrate only two pairs of conductive structures, this is of course a simple example for ease of explanation. In practice, any number of pairs of conductive structures may be provided (e.g., tens of conductive structure pairs, hundreds of conductive structure pairs, etc.). FIG. 6B illustrates double headed arrows at lower bond head 112 and at bonding stage 104. These double headed arrows illustrate scrub that may be provided at one or both of lower bond head 112 and at bonding stage 104. For example, motion systems 108 and 104a may be used to move respective ones of lower bond head 112 and at bonding stage 104 to provide the desired linear scrub (or non-linear scrub). Thus, it is understood that the scrub is not limited to any specific direction.

Figure 7A:
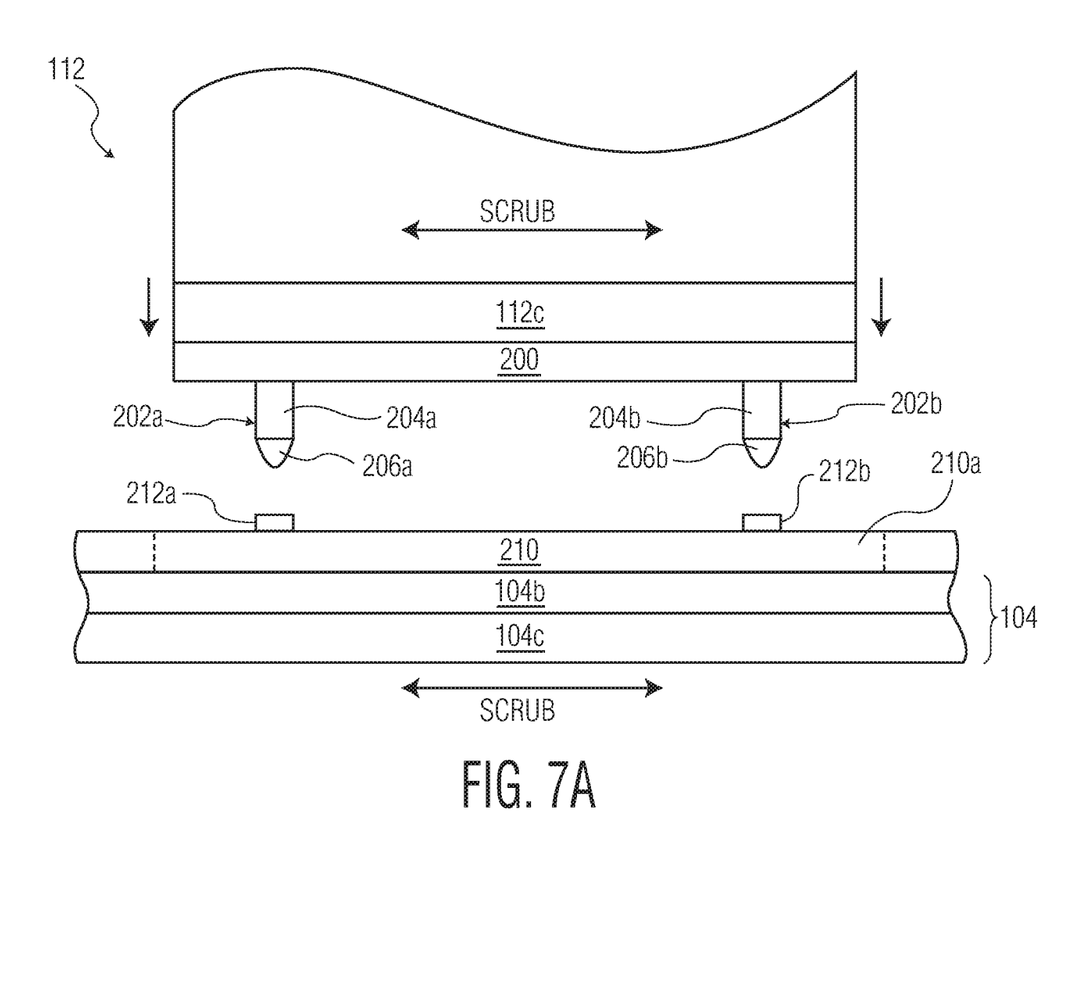
Figure 7B:
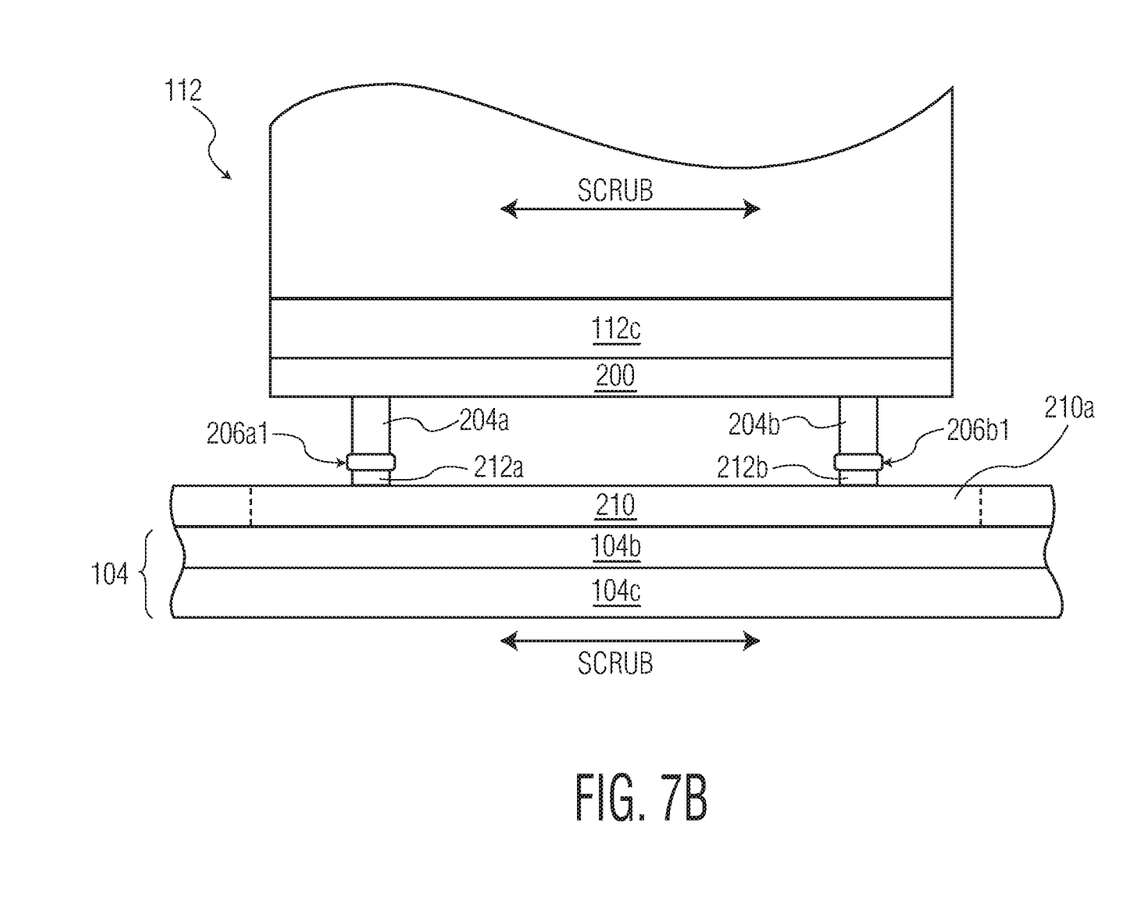

FIGS. 7A-7B illustrate the same elements as in FIGS. 6A-6B, except that FIG. 7A illustrates double headed arrows at lower bond head 112 and at bonding stage 104, making clear that the scrub provided by the motion system(s) may be initiated before contact between the respect upper and lower conductive structures.

Figure 8A:
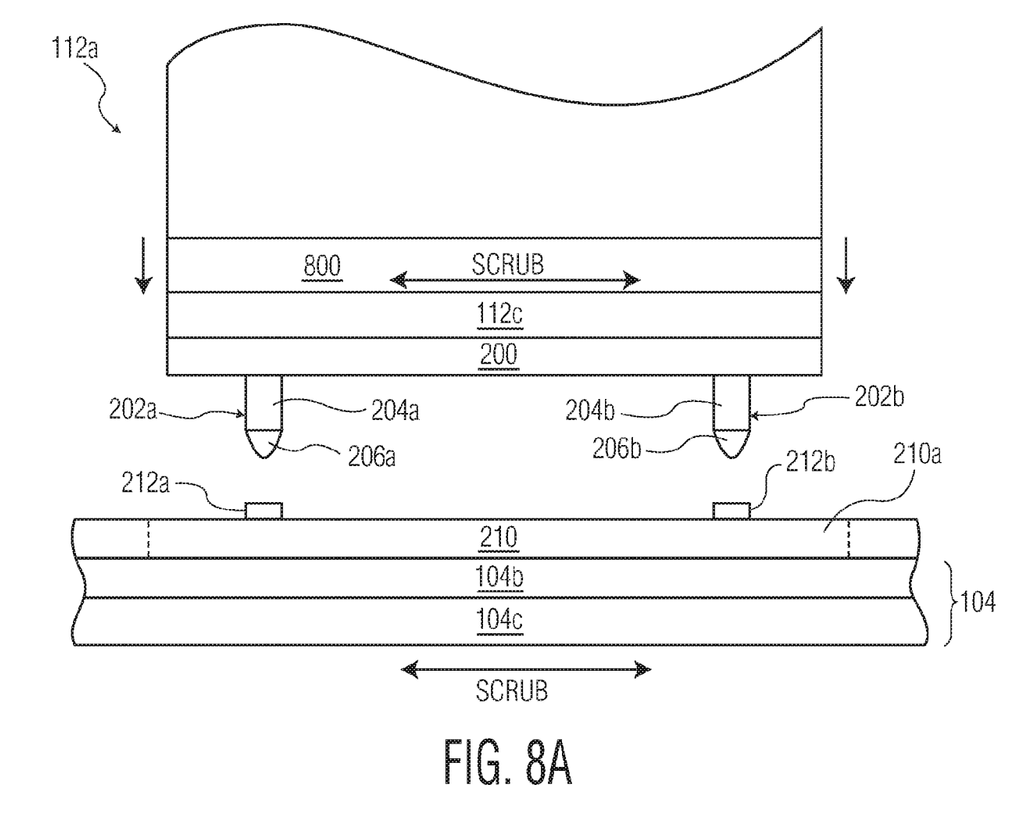
Figure 8B:
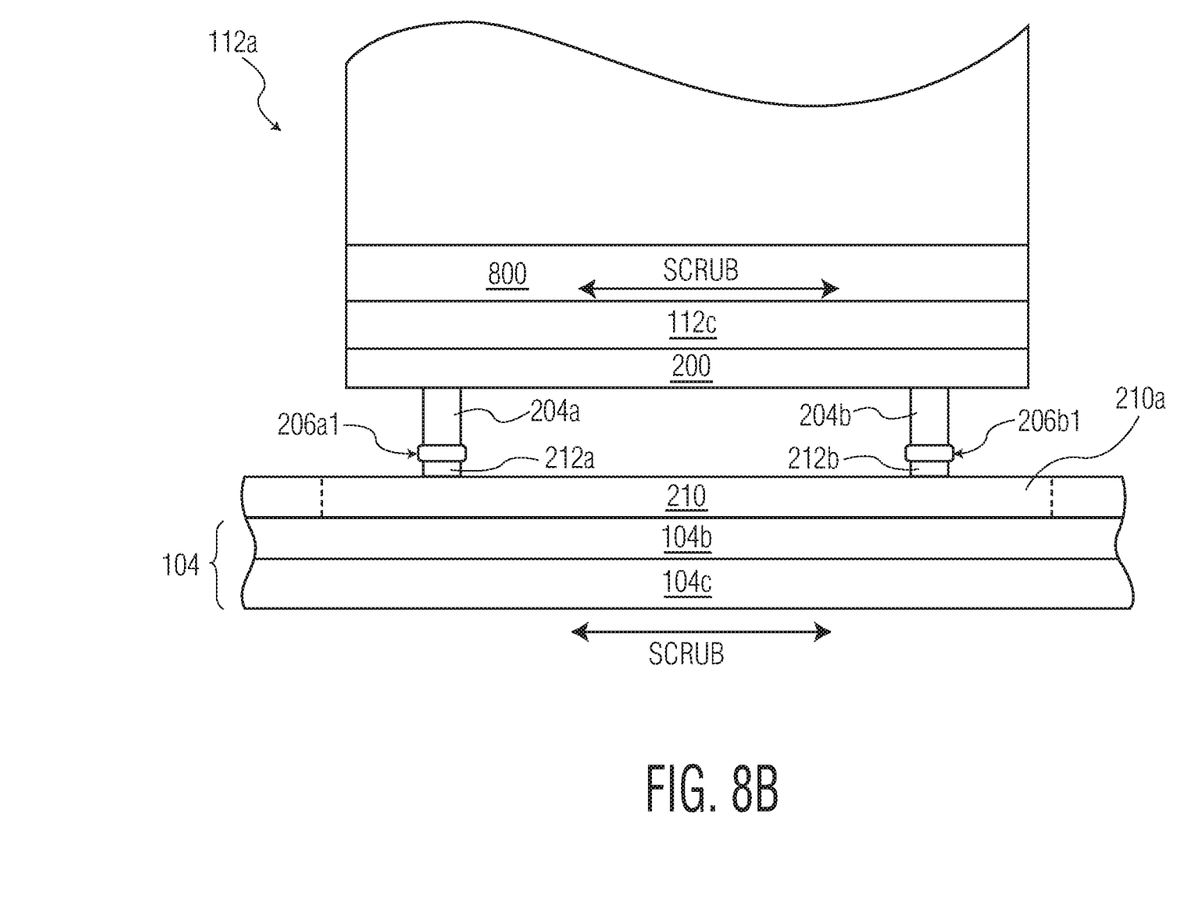

FIGS. 8A-8B illustrate the same elements as in FIGS. 7A-7B (and in FIGS. 6A-6B), except that the lower bond head 112a in FIGS. 8A-8B includes a motion system 800 for providing at least a portion of the relative motion between bonding tool 112c and substrate 210. That is, as opposed to using the motion system of the entire bond head assembly to provide the horizontal motion of bonding tool 112c, a separate motion system 800 is provided in lower bond head 112a. While motion system 800 illustrates double headed arrows along a certain axis, it is understood that the horizontal motion/scrub may be provided along any number of desired directions, and in any pattern, as desired. Further, while FIGS. 8A-8B illustrate the double headed arrows before (FIG. 8A) and after (FIG. 8B) contact, and at both the lower bond head (through motion system 800) and at the bonding location (through motion system 104a shown in FIG. 1), it is understood that the relative motion (scrub) may be provided using the desired systems, and at the desired times, based on the given application.

Figure 9:
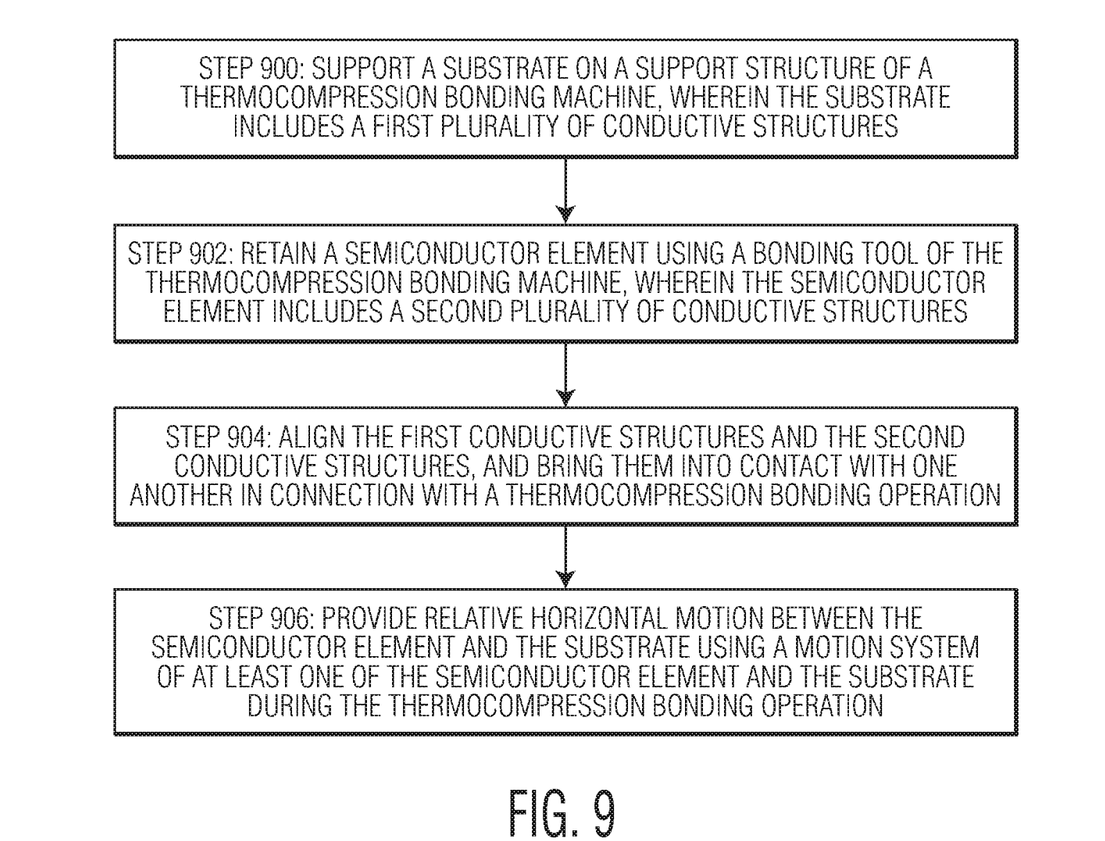
FIG. 9 is a flow diagram illustrating a method of operating a thermocompression bonder in accordance with an exemplary embodiment of the invention.

FIG. 9 illustrates a method of operating a thermocompression bonding system. As is understood by those skilled in the art, certain steps included in the flow diagram may be omitted; certain additional steps may be added; and the order of the steps may be altered from the order illustrated. At step 900, a substrate is supported on a support structure (e.g., substrate 210 on support structure 104b) of a thermocompression bonding machine, wherein the substrate includes a first plurality of conductive structures (e.g., lower conductive structures 212a, 212b). At step 902, a semiconductor element is retained using a bonding tool (e.g., semiconductor element 200 retained with bonding tool 112c) of the thermocompression bonding machine, wherein the semiconductor element includes a second plurality of conductive structures (e.g., upper conductive structures 202a, 202b). At step 904, the first conductive structures and the second conductive structures are aligned, and then brought them into contact with one another in connection with a thermocompression bonding operation. At step 906, relative horizontal motion is provided between the semiconductor element and the substrate using a motion system of at least one of the semiconductor element and the substrate during the thermocompression bonding operation. This relative motion may be provided, for example, using one or both of motion systems 108 and 104a. This relative motion may be commenced before, or after, step 904.

The relative motion provided between a semiconductor element and a corresponding substrate may be a motion profile, for example, that varies according to one or more variables such as (1) time, (2) a z-height of the bonding tool, (3) a bond force applied by the bonding tool, and (4) a temperature measured from at least one location of a bond head assembly including the bonding tool. For example, the variation of the relative motion may be a variation in amplitude, frequency, etc.

The relative motion provided between a semiconductor element and a corresponding substrate may be a low frequency movement with an example frequency range of between 1-1000 cycles/second.

The motions systems used to provide the relative motion (scrub) may desirably be existing motions systems used to drive the bonding tool (e.g., through a bond head assembly) and the support structure supporting the substrate. Such motion systems may include, for example, servo controlled linear motors. Additional exemplary motion systems include theta rotational motors (providing rotational scrub), stepper motors, screw drive motors, piezo actuators, and magnetostrictive actuators.

Although the invention is described primarily in connection with providing the relative movement between the semiconductor element and the substrate using an existing motion system (e.g., a linear motor used to drive a bond head assembly), a separate motion system may be provided, for example, as described above in connection with FIGS. 8A-8B. For example, a small piezo actuator may be provided very close to the heater/tool for providing localized relative movement.

Although the invention is described primarily in connection with providing substantially horizontal scrub motions (in an application where thermocompressive bond force is applied along a vertical z-axis), it is understood that the teachings may be applied to systems with alternative configurations such as the scrub being provided along a non-horizontal axis(axes).

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of operating a thermocompression bonding system, the method comprising the steps of:
    (a) bringing first conductive structures of a semiconductor element into contact with second conductive structures of a substrate during a thermocompression bonding operation; and
    (b) moving the semiconductor element relative to the substrate along at least one substantially horizontal direction using a motion system of at least one of the semiconductor element and the substrate to at least partially correct an offset in placement of the first conductive structures with respect to the second conductive structures during step (a).

2. The method of claim 1 wherein the step of moving includes moving the semiconductor element using a motion system adapted to move a bonding tool carrying the semiconductor element.

3. The method of claim 2 wherein the motion system includes a servo controlled linear motion system.

4. The method of claim 1 wherein the step of moving includes moving the substrate using a motion system adapted to move a support structure supporting the substrate.

5. The method of claim 4 wherein the motion system includes a servo controlled linear motion system.

6. The method of claim 1 wherein the step of moving includes moving the semiconductor element relative to the substrate along a plurality of substantially horizontal directions.

7. The method of claim 6 wherein movement along at least one of the plurality of substantially horizontal directions is provided using a motion system adapted to move a bonding tool carrying the semiconductor element.

8. The method of claim 6 wherein movement along at least one of the plurality of substantially horizontal directions is provided using a motion system adapted to move a support structure supporting the substrate.

9. The method of claim 6 wherein movement along at least one of the plurality of substantially horizontal directions is provided using a motion system adapted to move a bonding tool carrying the semiconductor element, and wherein movement along at least one of the plurality of substantially horizontal directions is provided using a motion system adapted to move a support structure supporting the substrate.

10. The method of claim 1 wherein the step of moving is commenced after bringing first conductive structures of the semiconductor element into contact with second conductive structures of the substrate.

11. The method of claim 1 wherein the step of moving is commenced before bringing first conductive structures of the semiconductor element into contact with second conductive structures of the substrate.

12. The method of claim 1 wherein the at least one substantially horizontal direction includes a linear direction.

13. The method of claim 1 wherein the at least one substantially horizontal direction includes a non-linear direction.

14. The method of claim 1 wherein the relative motion between the semiconductor element and the substrate varies as a function of time.

15. The method of claim 1 wherein the relative motion between the semiconductor element and the substrate varies as a function of a z-height of a bonding tool for bonding the semiconductor element to the substrate.

16. The method of claim 1 wherein the relative motion between the semiconductor element and the substrate varies as a function of a bond force applied by a bonding tool for bonding the semiconductor element to the substrate.

17. The method of claim 1 wherein the relative motion between the semiconductor element and the substrate varies as a function of a temperature measured from at least one location of a bond head assembly including a bonding tool for bonding the semiconductor element to the substrate.

18. The method of claim 1 wherein the relative motion between the semiconductor element and the substrate varies as a function of at least one of (1) time, (2) a z-height of a bonding tool for bonding the semiconductor element to the substrate, (3) a bond force applied by the bonding tool, and (4) a temperature measured from at least one location of a bond head assembly including the bonding tool.

19. The method of claim 1 wherein the step of moving the semiconductor element relative to the substrate includes using a motion system included in a lower bond head assembly carrying the bonding tool to provide the relative movement.

20. The method of claim 19 wherein the motion system included in the lower bond head assembly includes a piezo actuator.

21. A thermocompression bonder comprising:
a support structure for supporting a substrate;
a bonding tool for bonding a semiconductor element to the substrate; and
a motion system configured to provide relative movement between the semiconductor element and the substrate during a thermocompression bonding operation according to the method of claim 1.

22. The thermocompression bonder of claim 21 wherein the motion system is included in a lower bond head of the thermocompression bonder.

23. The thermocompression bonder of claim 21 wherein the motion system includes a piezo actuator.

* * * * *